United States Patent
Inoue et al.

(10) Patent No.: US 10,301,517 B2
(45) Date of Patent: May 28, 2019

(54) THERMOSETTING RESIN COMPOSITION

(71) Applicant: ASAHI KASEI KABUSHIKI KAISHA, Tokyo (JP)

(72) Inventors: Akinori Inoue, Tokyo (JP); Shozo Takada, Tokyo (JP)

(73) Assignee: ASAHI KASEI KABUSHIKI KAISHA, Tokyo (JP)

(*) Notice: Subject to any disclaimer, the term of this patent is extended or adjusted under 35 U.S.C. 154(b) by 128 days.

(21) Appl. No.: 15/473,170

(22) Filed: Mar. 29, 2017

(65) Prior Publication Data

US 2017/0283672 A1    Oct. 5, 2017

(30) Foreign Application Priority Data

Mar. 30, 2016 (JP) ................................ 2016-069290

(51) Int. Cl.

| | | |
|---|---|---|
| H01L 23/29 | (2006.01) | |
| C08G 59/20 | (2006.01) | |
| C08G 59/50 | (2006.01) | |
| C08L 63/00 | (2006.01) | |
| C09K 3/10 | (2006.01) | |
| C08K 3/36 | (2006.01) | |
| H01L 21/56 | (2006.01) | |
| C08K 3/013 | (2018.01) | |

(52) U.S. Cl.
CPC .............. *C09K 3/10* (2013.01); *C08G 59/20* (2013.01); *C08G 59/50* (2013.01); *C08K 3/013* (2018.01); *C08K 3/36* (2013.01); *C08L 63/00* (2013.01); *H01L 21/565* (2013.01); *H01L 23/293* (2013.01); *H01L 23/295* (2013.01); *C08K 2201/005* (2013.01); *C09K 2003/1078* (2013.01); *H01L 2224/48091* (2013.01); *H01L 2224/48247* (2013.01); *H01L 2224/73265* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,162,400 | A * | 11/1992 | Shiobara | C08G 59/3218 |
| | | | | 257/E23.119 |
| 6,190,786 | B1 * | 2/2001 | Hirano | C08G 59/245 |
| | | | | 257/E23.119 |
| 2008/0234409 | A1 | 9/2008 | Akagi et al. | |
| 2012/0292774 | A1 | 11/2012 | Itoh | |
| 2014/0264959 | A1 | 9/2014 | Okuhira et al. | |

FOREIGN PATENT DOCUMENTS

| | | |
|---|---|---|
| JP | 2-173035 A | 7/1990 |
| JP | 2007-204510 A | 8/2007 |
| JP | 2007-204511 A | 8/2007 |
| JP | 2012-97207 A | 5/2012 |
| JP | 2014-177584 A | 9/2014 |
| JP | 2016-37546 A | 3/2016 |
| WO | WO 2011/093038 A1 | 8/2011 |

OTHER PUBLICATIONS

Japanese Search Report, dated Dec. 13, 2016, for Japanese Application No. 2016-069290, with partial English translation.

* cited by examiner

*Primary Examiner* — Michael J Feely
(74) *Attorney, Agent, or Firm* — Birch, Stewart, Kolasch & Birch, LLP

(57) ABSTRACT

A resin composition including at least (A) an epoxy resin, (B) a curing agent and (C) an inorganic filler, satisfies the following conditions:

(I-I) the minimum modulus is no greater than $10^4$ MPa when evaluated at a set temperature of 200° C. after temperature increase from room temperature to 200° C. at 50° C./min by evaluation with a rheometer, and the final modulus is $10^5$ MPa or greater from 10 minutes after the initial temperature increase;

(I-II) the softening point of the epoxy resin (A) is 35° C. or higher;

(I-III) the residual solvent in the resin composition is no greater than 0.1%; and (I-IV) the equivalent value of the curing agent (B) is no greater than 90 g/eq and the softening point is 105° C. or higher.

6 Claims, 4 Drawing Sheets

FIG. 2(2-a)
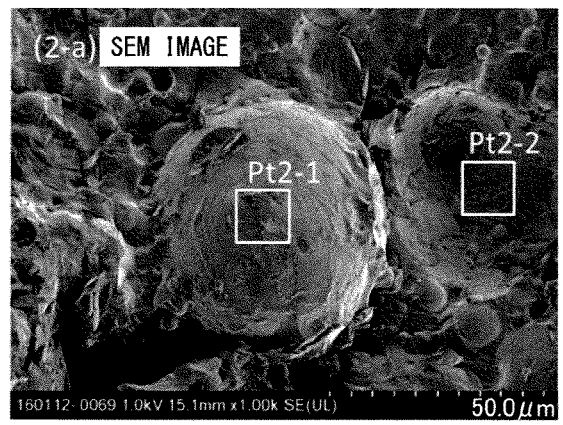
FIG. 2(2-b)
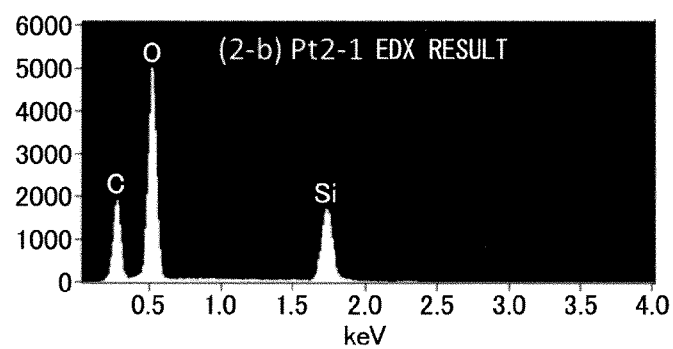
FIG. 2(2-c)
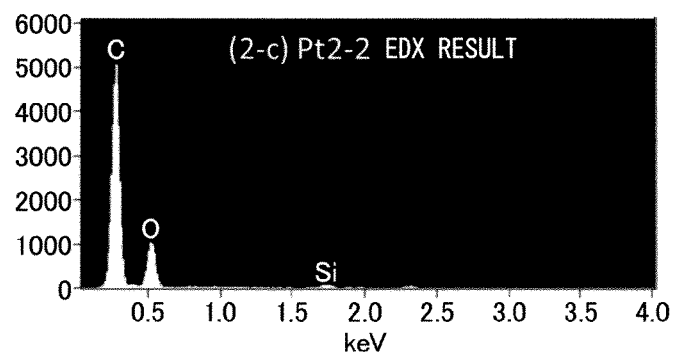

FIG. 3(3-a)
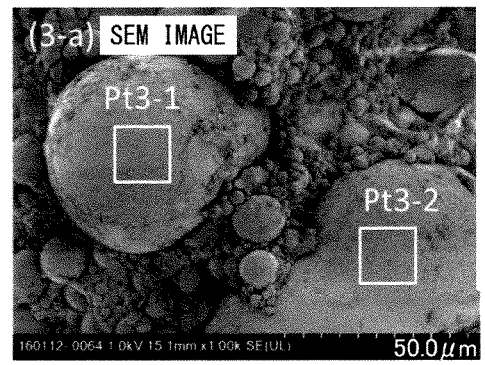
FIG. 3(3-b)
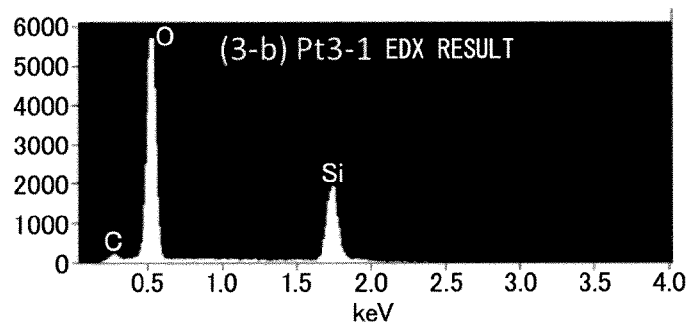
FIG. 3(3-c)
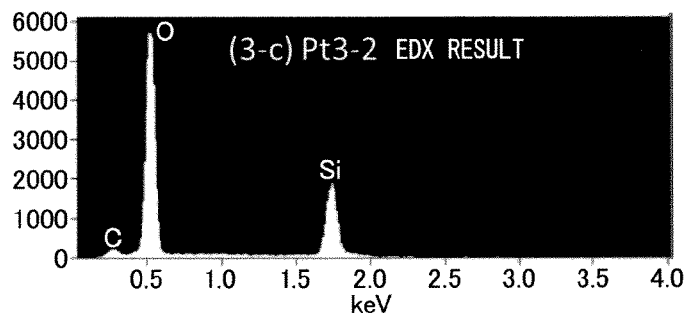

… (US 10,301,517 B2)

THERMOSETTING RESIN COMPOSITION

TECHNICAL FIELD

The present invention relates to a thermosetting resin composition that has excellent heat resistance when cured, to a sealing material using the curable resin composition, to a semiconductor device using the sealing material, and to a production method in which the semiconductor device is sealed.

BACKGROUND ART

Epoxy resin compositions are thermosetting resin compositions that are used in a wide range of fields including electrical and electronic parts, structural materials, adhesives and coating materials, because of their manageability and the excellent electrical characteristics, heat resistance, adhesion and humidity resistance (water resistance) of their cured products.

Sealing materials are used in electronic devices to protect the electronic parts such as semiconductor elements from factors in the external environment including impacts, pressure, humidity and heat. Such sealing materials have epoxy resins as the active compounds, and epoxy/phenol-based sealing materials with phenol resin curing agents are widely used.

Power semiconductors, such as on-vehicle power modules, are electronic devices considered to be an important key technology for achieving energy savings in electrical and electronic devices, and there is an increasing trend toward silicon carbide (SiC), gallium nitride (GaN) and diamond (C) semiconductors, known as wide band gap semiconductors, that promise higher current, smaller sizes and greater efficiency for power semiconductors, as well as higher efficiency than conventional silicon (Si) semiconductors. The advantage of SiC semiconductors is their ability to operate under higher temperature conditions, and therefore semiconductor sealing materials must have even higher heat resistance than currently exhibited.

In the case of power semiconductors with high voltage resistance specifications, the working voltage may reach from several hundred to several thousand volts. Under such high voltage conditions, defects have been reported to occur due to the phenomenon of partial discharge. Partial discharge is the phenomenon in which local discharge between an electrode and an insulator surface (surface corona) or discharge in the gap (void) inside an insulator (void corona) causes corrosion of the insulator.

With a crosslinkable polymer, higher crosslink density prevents breakdown caused by electric field-accelerated electrons and helps minimize formation of fine pores, potentially improving the insulating property. Minimizing formation of fine pores in the cured product in the steps of resin molding such as transfer molding is also thought to improve the insulating property.

Materials reported to have excellent heat resistance include heat-resistant resin compositions comprising maleimide compounds and polyamines (see PATENT DOCUMENT 1), and bismaleimide resins modified with polybenzoxazine (see PATENT DOCUMENT 2). Such heat-resistant resin compositions, when cured, can exhibit excellent heat resistance.

PRIOR ART DOCUMENTS

PATENT DOCUMENT 1 Japanese Unexamined Patent Publication No. 2014-177584

PATENT DOCUMENT 2 Japanese Unexamined Patent Publication No. 2012-97207

Even when high heat-resistant resins such as those mentioned above are used, however, it has not been possible to obtain sufficient resistance in heat cycle tests with repeated heating/cooling, used to simulate an actual high temperature operation device, and in power cycle tests that model the high-temperature operating state of an element.

SUMMARY OF INVENTION

Problems to be Solved by the Invention

The present invention has been accomplished in light of this background, and its object is to provide a curable resin composition that can exhibit sufficient resistance in heat cycle testing and/or power cycle testing, a sealing material using the curable resin composition, a semiconductor device using the sealing material, and a method for producing the semiconductor device.

Means for Solving the Problems

The present inventors have completed this invention as a result of diligent research in light of the circumstances described above. Specifically, the present invention provides the following:

[1]

A resin composition including (A) an epoxy resin, (B) a curing agent and (C) an inorganic filler, and satisfying the following conditions:

(I-I) the minimum modulus is no greater than $10^4$ MPa by evaluation with a rheometer when evaluated at a set temperature of 200° C. after temperature increase from 23° C. to 200° C. at 50° C./min, and the final modulus is $10^5$ MPa or greater from 10 min after the initial temperature increase;

(I-II) the softening point of the epoxy resin (A) is 35° C. or higher;

(I-III) the residual solvent in the resin composition is less than 0.1 wt %; and (I-VI) the equivalent value of the curing agent (B) is no greater than 90 g/eq, and the softening point is 105° C. or higher.

[2]

A resin composition including (A) an epoxy resin, (B) a curing agent and (C) an inorganic filler, and satisfying the following conditions:

(II-I) the abundance ratio of C atoms of the epoxy resin (A) or curing agent (B) and X atoms of the inorganic filler (C), based on EDX measurement, on the surface of the inorganic filler (C) in the resin composition, is such that C/X=≥1, where the X atoms are atoms other than C, O, H or N atoms in the main component of the inorganic filler (C) (the component present in a range of 1 to 95 mol %), and X is defined as the molar concentration of X atoms;

(II-II) the weight percentage of the inorganic filler (C) in the resin composition is no greater than 95 wt %;

(II-III) the mean particle size of the inorganic filler (C) is 0.5 μm or greater;

(II-IV) a ratio of the specific surface area of the inorganic filler (C) for the total resin composition is no greater than 3 m²/g;

(II-V) the softening point of the epoxy resin (A) is 35° C. or higher;

(II-VI) the residual solvent in the resin composition is less than 0.1 wt %; and (II-VII) the equivalent value of the curing agent (B) is no greater than 90 g/eq and the softening point is 105° C. or higher.

[3]

A resin composition according to [1] or [2] above, wherein the curing agent (B) is a compound with amino groups.

[4]

A sealing material comprising the cured product of a resin composition according to any one of [1] to [3] above.

[5]

A semiconductor device wherein a semiconductor element is sealed with a sealing material according to [4] above.

[6]

A method for producing a semiconductor device, including a step of sealing a semiconductor element by compression molding using a sealing material according to [4] above.

Effects of the Invention

The resin composition of the invention, when cured, has sufficient chemical heat resistance and crosslink density, and supports adequate moldability. When it is applied in a transfer molding step, therefore, excessive pressure is less likely to be exerted on elements and wirings to be sealed, and the sealed elements are less likely to form defects. Moreover, the cured product itself has heat resistance and is resistant to formation of fine pores that can lead to defects during the transfer molding step, and exhibits excellent performance in heat cycle testing and/or power cycle testing.

A sealing material composed of the cured resin composition of the invention can exhibit its excellent heat resistance. It is therefore suitable as a sealing material for electronic device products using SiC substrates, for example.

Moreover, an electronic device product using the sealing material of the invention can adequately exhibit the performance of the sealing material even under the high operating temperature environment of 200° C., for example. It can therefore be utilized as an electronic device product with excellent reliability at high temperature.

FIG. **2(2-*a*) is a surface image taken by scanning electron microscope (SEM) of a tablet of the resin composition obtained in Example 1, FIG. 2(2-*b*) shows the elemental distribution by energy dispersive X-ray (EDX) analysis of the inorganic filler surface (Pt2-1) of the tablet, and FIG. 2(2-*c*) shows the elemental distribution by EDX analysis of the detached portion (Pt2-2**) of the inorganic filler of the tablet.

FIG. **3(3-*a*) is a surface image taken by SEM of a tablet of the resin composition obtained in Comparative Example 1, and FIG. 3(3-*b*) and FIG. 3(3-*c*) show elemental distributions by EDX of the inorganic filler surfaces (Pt3-1) and (Pt3-2**), respectively, of the tablet.

Figure 4:
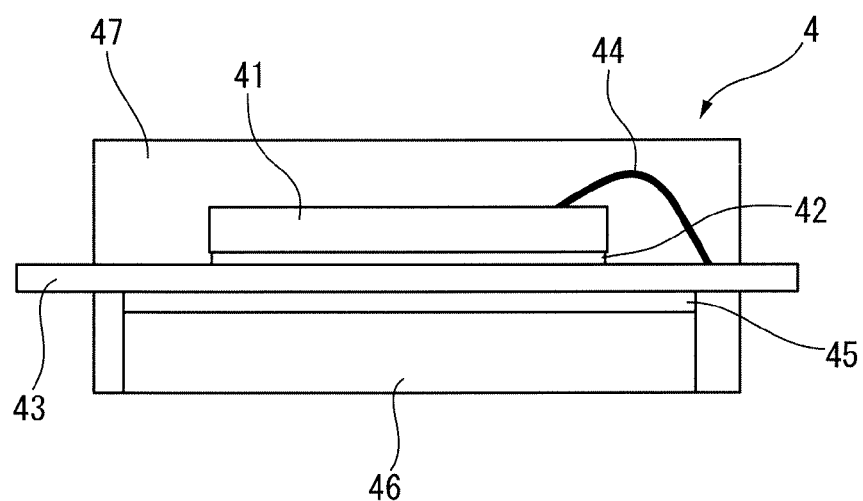

FIG. 4 is a schematic diagram of a power semiconductor device to be used for the embodiment.

EMBODIMENTS FOR CARRYING OUT THE INVENTION

The following resin composition may be described as one mode of the invention. Specifically, it is a resin composition:

including (A) an epoxy resin, (B) a curing agent and (C) an inorganic filler, and satisfying the following conditions:

(I-I) the minimum modulus is no greater than $10^4$ MPa when evaluated at a set temperature of 200° C. after temperature increase from 23° C. to 200° C. at 50° C./min, by evaluation with a rheometer, and the final modulus is $10^5$ MPa or greater from 10 min after the initial temperature increase;

(I-II) the softening point of the epoxy resin (A) is 35° C. or higher;

(I-III) the residual solvent in the resin composition is less than 0.1 wt %; and (I-IV) the equivalent value of the curing agent is no greater than 90 g/eq and the softening point is 105° C. or higher.

The resin composition of the invention, with a minimum modulus value limited to no greater than $10^4$ MPa, has a sufficient flowability when molding in a transfer molding step, and therefore excess pressure is not exerted on elements and wirings to be sealed, while the cured product also has heat resistance because of its sufficient crosslink density, so that sufficient resistance can be obtained in heat cycle testing and/or power cycle testing. Specifically, by limiting the minimum modulus value to no greater than $10^4$ MPa, excess pressure is less likely to be exerted on elements and wirings to be sealed, during molding in the transfer molding step, and it is possible to fill the resin into the mold with fewer fine pores being formed in the cured product after sealing, thereby allowing the resistance in heat cycle testing and/or power cycle testing to be increased. If the minimum modulus is higher it will be difficult to accomplish proper filling, and defects will tend to be produced during heat cycle testing and/or power cycle testing. If the final modulus is $10^5$ MPa or smaller, the curing will be insufficient and problems may result, such as deformation of the molded article. By limiting the softening point of the epoxy resin (A) to 35° C. or higher, it is possible to ensure heat resistance of the cured product and to increase resistance in heat cycle testing and/or power cycle testing. If the residual solvent in the resin composition is less than 0.1 mass %, this will minimize defects such as swelling caused by the residual solvent in the transfer molding step, and can increase the resistance in heat cycle testing and/or power cycle testing. In addition, if the equivalent value of the curing agent (B) is no greater than 90 g/eq it will be possible to ensure the crosslink density and heat resistance of the cured product, thereby allowing resistance to be increased in heat cycle testing and/or power cycle testing. Likewise, by limiting the softening point of the curing agent (B) to 105° C. or higher, it is possible to ensure the heat resistance of the cured product and to increase its resistance in heat cycle testing and/or power cycle testing.

The minimum modulus value according to the invention can be achieved, for example, by adequately covering the inorganic filler (C) with the epoxy resin (A) or curing agent (B), by limiting the weight percentage of the inorganic filler (C) to no greater than 95 wt %, by limiting the mean particle size of the inorganic filler (C) to 0.5 μm or greater, or by limiting the specific surface area of the inorganic filler (C) with respect to the total resin composition to no greater than 3 $m^2/g$.

The heat resistance of the cured product of the invention can be exhibited by adding an epoxy resin (A) with a softening point of 35° C. or higher to the resin composition, or by adding a curing agent (B) with an equivalent value of no greater than 90 g/eq and a softening point of 105° C. or higher to the resin composition.

The following resin composition may also be described as one mode of the invention. Specifically, it is a resin composition including (A) an epoxy resin, (B) a curing agent and (C) an inorganic filler, and satisfying the following conditions:

(II-I) the abundance ratio of C atoms of the epoxy resin (A) or curing agent (B) and X atoms of the inorganic filler (C), based on EDX measurement, on the surface of the inorganic filler (C) in the resin composition, is such that C/X=≥1
{where the X atoms are atoms other than C, O, H or N atoms in the main component of the inorganic filler (C) (the component present in a range of 1 to 95 mol %), and X is defined as the molar concentration of X atoms};

(II-II) the weight percentage of the inorganic filler (C) in the resin composition is no greater than 95 wt %;

(II-III) the mean particle size of the inorganic filler (C) is 0.5 μm or greater;

(II-IV) the specific surface area of the inorganic filler (C) with respect to the total resin composition is no greater than 3 $m^2/g$;

(II-V) the softening point of the epoxy resin (A) is 35° C. or higher;

(II-VI) the residual solvent in the resin composition is less than 0.1 wt %; and (II-VII) the equivalent value of the curing agent (B) is no greater than 90 g/eq and the softening point is 105° C. or higher.

By specifying C/X 1 for the abundance ratio of C atoms of the epoxy resin (A) or the curing agent (B) and X atoms of the inorganic filler (C), the inorganic filler (C) has satisfactory sliding property during molding in the transfer molding step, excess pressure is less likely to be exerted on the elements and wirings to be sealed, and the sealed cured product is less likely to generatefine pores in the cured product, and it is therefore possible to increase the resistance in heat cycle testing and/or power cycle testing. Likewise, by limiting the weight percentage of the inorganic filler (C) to no greater than 95 wt %, the composition in the transfer molding step is has sufficient flowability, and it is possible to increase the moldability and the resistance in heat cycle testing and/or power cycle testing. Likewise, by limiting the mean particle size of the inorganic filler (C) to 0.5 μm or greater, the flowability of the composition in the transfer molding step is sufficient, and it is possible to increase the moldability and the resistance in heat cycle testing and/or power cycle testing. Moreover, by limiting the specific surface area of the inorganic filler (C) with respect to the total resin composition to no greater than 3 $m^2/g$, the flowability of the composition in the transfer molding step is sufficient, and it is possible to increase the moldability and the resistance in heat cycle testing and/or power cycle testing. If the amount of inorganic filler (C) is too high, the composition in the transfer molding step will exhibit poor flowability, molding defects may be generated, and defects will tend to be produced in heat cycle testing and/or power cycle testing. Likewise, if the mean particle size of the inorganic filler (C) is smaller than the range specified above, the composition in the transfer molding step will exhibit poor flowability, molding defects may be generated, and defects will tend to be produced in heat cycle testing and/or power cycle testing. Similarly, if the specific surface area of the inorganic filler (C) with respect to the total resin composition is too large, the flowability during transfer molding will become poor, molding defects may be generated, and defects will tend to be produced in heat cycle testing and/or power cycle testing. By limiting the softening point of the epoxy resin (A) to 35° C. or higher, it is possible to ensure heat resistance of the cured product and to increase resistance in heat cycle testing and/or power cycle testing. If the residual solvent in the resin composition is less than 0.1 mass %, this will minimize defects such as swelling caused by residual solvent in the transfer molding step, and can increase the resistance in heat cycle testing and/or power cycle testing. If the equivalent value of the curing agent (B) is no greater than 90 g/eq it will be possible to ensure crosslink density and heat resistance of the cured product, thereby allowing resistance to be increased in heat cycle testing and/or power cycle testing. Likewise, by limiting the softening point of the curing agent (B) to 105° C. or higher, it is possible to ensure heat resistance of the cured product and to increase resistance in heat cycle testing and/or power cycle testing.

The resin composition of the invention includes the epoxy resin (A), curing agent (B) and inorganic filler (C) as essential components, but it may also include other components.

The resin composition of the invention has a minimum modulus of preferably no greater than $10^4$ MPa, more preferably no greater than $10^3$ MPa and even more preferably no greater than $10^2$ MPa at 23 to 200° C. before thermosetting treatment. If the modulus value is within this range, it will be possible to prevent pressure-induced damage to semiconductor elements and to element wirings, as well as formation of voids in the cured product caused by an insufficient flow property during the transfer molding step.

The modulus after 10 min from the start of temperature increase under these conditions is preferably $10^5$ MPa or greater, more preferably $10^6$ MPa or greater and even more preferably $10^7$ MPa or greater. If the modulus value is within this range, it will be possible to sufficiently cure the resin during molding in the transfer molding step.

The modulus is the value of the loss elastic modulus measured by the parallel plate method using a rheometer (DHR-2 by TA Instruments). More specifically, the modulus is measured with a 2000 μm gap, a rotation plate diameter of 8 mm, a frequency of 1.0 Hz, a strain of 0.1%, temperature increase from 23° C. to 200° C. at a rate of 50° C./min and holding at 200° C., by which the minimum modulus and the modulus after 10 minutes can be determined.

The components of the resin composition of the invention will now be explained in detail.

[(A) Epoxy Resin]

The epoxy resin (A) may generally be a monomer, oligomer or polymer with two or more epoxy groups per molecule, with no particular restrictions on the molecular weight or molecular structure, and examples include bisphenol-type epoxy resins such as bisphenol A-type epoxy resins, bisphenol F-type epoxy resins and tetramethylbisphenol F-type epoxy resins, biphenyl-type epoxy resins such as biphenyl-type epoxy resins and tetramethylbiphenyl-type epoxy resins, crystalline epoxy resins such as stilbene-type epoxy resins and hydroquinone-type epoxy resins; novolac-type epoxy resins such as cresol-novolac-type epoxy resins, phenol-novolac-type epoxy resins and naphthol-novolac-type epoxy resins; phenolaralkyl-type epoxy resins such as phenylene backbone-containing phenolaralkyl-type epoxy resins, biphenylene backbone-containing phenolaralkyl-type epoxy resins, phenylene backbone-containing naphtholaralkyl-type epoxy resins and alkoxynaphthalene backbone-containing phenolaralkyl epoxy resins; trifunctional epoxy resins such as triphenolmethane-type epoxy resins and alkyl-modified triphenolmethane-type epoxy resins; modified phenol-type epoxy resins such as dicyclopentadiene-modified phenol-type epoxy resins and terpene-modified phenol-type epoxy resins; heterocyclic ring-containing epoxy resins such as triazine nucleus-containing epoxy resins; and phosphorus atom-containing epoxy resins, any one or a combination of two or more of which may be used.

Preferred among these compounds are triphenolmethane-type epoxy resins such as EPPN501H, EPPN501, EPPN501HY, EPPN502 and EPPN502H (product of Nippon Kayaku Co., Ltd.), and dicyclopentadiene types such as XD-1000 2L and XD-1000 (both by Nippon Kayaku Co., Ltd.), and HP-7200 and HP-7200H (both by DIC Corp.).

Phosphorus atom-containing epoxy resins include epoxidated compounds of 9,10-dihydro-9-oxa-10-phosphaphenanthrene-10-oxide (hereunder abbreviated as "HCA"), epoxidated compounds of phenol resins obtained by reacting HCA with a quinone, epoxy resins that are phenol-novolac-type epoxy resins modified with HCA, epoxy resins that are cresol-novolac-type epoxy resins modified with HCA, and epoxy resins obtained by modifying bisphenol A-type epoxy resins with phenol resins obtained by reacting HCA with a quinone.

The softening point of the epoxy resin (A) is preferably 35° C. or higher from the viewpoint of heat resistance of the cured product, and it is more preferably 50° C. or higher and even more preferably 60° C. or higher. There is no particular restriction on the upper limit of the softening point of the epoxy resin, but it is preferably no higher than 130° C. from the viewpoint of ensuring reactivity of the epoxy resin.

The softening point referred to herein can be measured by the ring and ball method based on JIS K2351, for example.

The lower limit for the mixing proportion of the total epoxy resin is not particularly restricted, but it is preferably 5 mass % or greater, more preferably 10 mass % or greater and even more preferably 17 mass % or greater in the total resin composition. If the lower limit of the mixing proportion is within this range there will be less risk of reducing the flow property. The upper limit for the mixing proportion of the total epoxy resin is also not particularly restricted, but it is preferably no greater than 50 mass % and more preferably no greater than 40 mass % in the total resin composition. If the upper limit for the mixing proportion is within this range, it will be easier to match the coefficient of thermal expansion with that of the surrounding materials. In order to improve the melt property of the resin, it is preferred to appropriately adjust the mixing proportion according to the type of epoxy resin used.

[Curing Agent (B)]

The curing agent (B) is not particularly restricted so long as it reacts with the epoxy resin to accomplish curing, and examples include linear aliphatic diamines with 2 to 20 carbon atoms such as ethylenediamine, trimethylenediamine, tetramethylenediamine and hexamethylenediamine, and other amines such as metaphenylenediamine, paraphenylenediamine, paraxylenediamine, 4,4'-diaminodiphenylmethane, 4,4'-diaminodiphenylpropane, 4,4'-diaminodiphenyl ether, 4,4'-diaminodiphenylsulfone, 4,4'-diaminodicyclohexane, bis(4-aminophenyl)phenylmethane, 1,5-diaminonaphthalene, metaxylenediamine, paraxylenediamine, 1,1-bis(4-aminophenyl)cyclohexane and dicyanodiamide; resol-type phenol resins such as aniline-modified resol resins and dimethyl ether resol resins; novolac-type phenol resins such as phenol-novolac resins, cresol-novolac resins, tert-butylphenol-novolac resins and nonylphenol-novolac resins; phenolaralkyl resins such as phenylene backbone-containing phenolaralkyl resins and biphenylene backbone-containing phenolaralkyl resins; phenol resins with condensed polycyclic structures such as naphthalene backbones or anthracene backbones; polyoxystyrenes such as polyparaoxystyrene; acid anhydrides including alicyclic acid anhydrides such as hexahydrophthalic anhydride (HHPA) and methyltetrahydrophthalic anhydride (MTHPA) and aromatic acid anhydrides such as trimellitic anhydride (TMA), pyromellitic anhydride (PMDA) and benzophenonetetracarboxylic acid (BTDA); polymercaptane compounds such as polysulfides, thioesters and thioethers; isocyanate compounds such as isocyanate prepolymers and blocked isocyanates; and organic acids such as carboxylic acid-containing polyester resins. These may be used alone or in combinations of two or more.

The equivalent value of the curing agent is preferably no greater than 90 g/eq, more preferably 80 g/eq and even more preferably no greater than 70 g/eq, from the viewpoint of heat resistance of the cured product. If the equivalent value of the cured product is within this range, it will be possible to ensure adequate crosslink density for the cured product and to obtain physical heat resistance.

The equivalent value of the curing agent is defined as the number of grams that includes 1 equivalent of active hydrogen in the curing agent.

From the viewpoint of heat resistance of the cured product, the softening point of the curing agent is preferably 105° C. or higher, more preferably 140° C. or higher and even more preferably 170° C. or higher. If the softening point of the curing agent is within this range, the cured product will be able to exhibit chemically adequate heat resistance.

Preferred curing agents include 4,4'-diaminodiphenylsulfone (DDS), 3,3'-diaminodiphenylsulfone, 1,3-bis(3-aminophenoxy)benzene, 4, 4,4'-diaminodiphenyl ether, 1,3-bis[2-(4-aminophenyl)-2-propyl]benzene, α,α'-bis(4-aminophenyl)-1,4-diisopropylbenzene and paraphenylenediamine.

Also, from the viewpoint of reliability and ensuring crosslink density, the curing agent used in a semiconductor sealing material is preferably an amine-based or amino-based compound, and more preferably at least one diamine compound selected from the group consisting of aromatic diamine compounds, aromatic bisaminophenol compounds, alicyclic diamines, straight-chain aliphatic diamines and siloxanediamines.

Aromatic bisaminophenol compounds include 3,3'-dihydroxybenzidine, 3,3'-diamino-4,4'-dihydroxybiphenyl, 3,3'-dihydroxy-4,4'-diaminodiphenylsulfone, bis-(3-amino-4-hydroxyphenyl)methane, 2,2-bis-(3-amino-4-hydroxyphenyl)propane, 2,2-bis-(3-amino-4-hydroxyphenyl)hexafluoropropane, 2,2-bis-(3-hydroxy-4-aminophenyl)hexafluoropropane, bis-(3-hydroxy-4-aminophenyl)methane, 2,2-bis-(3-hydroxy-4-aminophenyl)propane, 3,3'-dihydroxy-4,4'-diaminobenzophenone, 3,3'-dihydroxy-4,4'-diaminodiphenyl ether, 4,4'-dihydroxy-3,3'-diaminodiphenyl ether, 2,5-dihydroxy-1,4-diaminobenzene, 4,6-diaminoresorcinol, 1,1-bis(3-amino-4-hydroxyphenyl)cyclohexane and 4,4-(α-methylbenzylidene)-bis(2-aminophenol).

Alicyclic diamine compounds include 1,3-diaminocyclopentane, 1,3-diaminocyclohexane, 1,3-diamino-1-methylcyclohexane, 3,5-diamino-1,1-dimethylcyclohexane, 1,5-diamino-1,3-dimethylcyclohexane, 1,3-diamino-1-methyl-4-isopropylcyclohexane, 1,2-diamino-4-methylcyclohexane, 1,4-diaminocyclohexane, 1,4-diamino-2,5-diethylcyclohexane, 1,3-bis(aminomethyl)cyclohexane, 1,4-bis(aminomethyl)cyclohexane, 2-(3-aminocyclopentyl)-2-propylamine, mensen*diamine, isophorone diamine, norbornanediamine, 1-cycloheptene-3,7-diamine, 4,4'-methylenebis(cyclohexylamine), 4,4'-methylenebis(2-methylcyclohexylamine), 1,4-bis(3-aminopropyl)piperazine and 3,9-bis(3-aminopropyl)-2,4,8,10-tetraoxaspiro-[5,5]-undecane.

Straight-chain aliphatic diamine compounds include hydrocarbon-type diamines such as 1,2-diaminoethane, 1,4-diaminobutane, 1,6-diaminohexane, 1,8-diaminooctane, 1,10-diaminodecane and 1,12-diaminododecane, and alkylene oxide-type diamines such as 2-(2-aminoethoxy)ethylamine, 2,2'-(ethylenedioxy)diethylamine and bis[2-(2-aminoethoxy)ethyl]ether.

Siloxanediamine compounds include dimethyl (poly)siloxanediamine, such as PAM-E, KF-8010 and X-22-161A which are trademarks of Shin-Etsu Chemical Co., Ltd.

When the curing agent is to be used, the mixing ratio of the total epoxy resin with the total curing agent is preferably between 0.8 and 1.3, inclusive, as the equivalent ratio of the number of epoxy groups (EP) of the total epoxy resin and the equivalent value of the total curing agent. If the equivalent ratio is within this range, it is possible to obtain sufficient curability during molding of the resin composition. Moreover, if the equivalent ratio is within this range it is possible to obtain satisfactory physical properties for the cured resin. In consideration of heat resistance of the resin composition, the equivalent ratio is preferably close to 1.0 to allow increase in the curability of the resin composition and the glass transition temperature or heated elastic modulus of the cured resin.

[Inorganic Filler (C)]

The inorganic filler (C) is not particularly restricted so long as it has a satisfactory melt property in the resin composition of the invention, and examples include silica such as molten crushed silica, molten spherical silica, crystalline silica and two-dimensional aggregated silica, and alumina, silicon nitride, aluminum nitride, boron nitride, titanium oxide, silicon carbide, aluminum hydroxide, magnesium hydroxide, titanium white, talc, clay, mica, glass fiber and the like. Molten spherical silica is particularly preferred among those mentioned above. The particle shapes are preferably as spherical as possible, and the filling volume can be increased by mixing particles of different sizes. In order to increase the melt property of the resin composition, it is preferred to use molten spherical silica.

The upper limit for the content ratio of the inorganic filler (C) is preferably no greater than 95 mass %, more preferably no greater than 90 mass % and even more preferably no greater than 83 mass %, based on the total epoxy resin composition for sealing according to the invention. If the upper limit for the content ratio of the inorganic filler is within this range, it will be possible to obtain satisfactory results in heat cycle testing after curing, without decreasing flowability of the resin composition. The lower limit for the content ratio of the inorganic filler is not particularly restricted, but it is preferably 50 mass % or greater and more preferably 60 mass % or greater in the total resin composition. If the upper limit for the mixing proportion is within this range, it will be easier to match the coefficient of thermal expansion with that of the surrounding members.

The lower limit for the mean particle size (D50) of the inorganic filler (C) is preferably 0.5 μm or greater, more preferably 1 μm or greater and even more preferably 4 μm or greater. There is no particular restriction on the upper limit for the mean particle size of the inorganic filler, but it is preferably no greater than 50 μm and even more preferably no greater than 40 μm. Also, the maximum particle size is preferably no greater than 105 μm. If the mean particle size is less than 0.5 μm, the flowability of the resin composition will be decreased, potentially impairing the moldability. If the mean particle size is greater than 40 μm, on the other hand, warping of the molded article may occur, and the dimensional precision can potentially be lowered. If the maximum particle size is greater than 105 μm, the moldability may be reduced.

The mean particle size (D50) of the inorganic filler (C) referred to herein can be determined as follows: with a laser diffraction particle size distribution analyzer (Helos & Rodos by Sympatec), the mean particle size being the particle size (D50) at which the cumulative volume is 50% in the particle size distribution was measured with the same analyzer.

The inorganic filler used may consist of two or more inorganic fillers with different specific surface areas (SSA) and/or mean particle sizes (D50).

The inorganic filler (C) may be a single type or a mixture of two or more types, and the specific surface area (SSA) with respect to the total (D) composition is preferably no greater than 3 $m^2/g$, more preferably no greater than 2.5 $m^2/g$ and even more preferably no greater than 2 $m^2/g$. If the specific surface area (SSA) with respect to the total composition is within this range, it will be easier to ensure the flowability of the resin composition.

The specific surface area (SSA) of the inorganic filler (C) referred to herein can be determined, for example, by the BET method using a specific surface area meter.

The specific surface area (SSA) of the inorganic filler (C) with respect to the total (D) composition, as referred to herein, can be determined, for example, by the following formula:

$$\text{Specific surface area (SSA) with respect to total composition} = A \times X + B \times Y,$$

when using a mixture of two different inorganic fillers, an inorganic filler with the specific surface area A $m^2/g$ and the amount X wt %, and an inorganic filler with the specific surface area B $m^2/g$ and the amount Y wt %.

If necessary, a curing accelerator may be mixed with the resin composition of the invention, in addition to the components mentioned above. The curing accelerator may be any one that accelerates the curing reaction between the epoxy groups and the curing agent, and it may be one generally used for sealing materials. Specific examples include organic phosphorus atom-containing compounds such as organic phosphines, tetra-substituted phosphonium compounds, phosphobetaine compounds, addition products of phosphine compounds and quinone compounds and addition products of phosphonium compounds and silane compounds; amidine-based compounds such as 1,8-diazabicyclo(5,4,0)undecene-7 and imidazole; nitrogen atom-containing compounds, representative of which are tertiary amines such as benzyldimethylamine or amidinium salts that are quaternary onium salts, ammonium salts, or amine complex salts of the aforementioned compounds, and boron compounds, organic acid metal salts, Lewis acids and the like.

The lower limit for the mixing proportion of the total curing accelerator is also not particularly restricted, but it is preferably 0.1 mass % or greater in the total resin composition. If the lower limit for the mixing proportion of the total curing accelerator is within this range, it will be possible to obtain sufficient curability. The upper limit for the mixing proportion of the total curing accelerator is also not particularly restricted, but it is preferably no greater than 1 mass % in the total resin composition. If the upper limit for the mixing proportion of the total curing accelerator is within this range, it will be possible to obtain a sufficient flow property. In order to improve the melt property of the resin, it is preferred to appropriately adjust the mixing proportion according to the type of curing accelerator used.

If necessary, a coupling agent may be mixed with the resin composition of the invention, in addition to the components mentioned above. The coupling agent used may be any of the publicly known coupling agents that include silane-based compounds such as epoxysilane, mercaptosilane, aminosilane, alkylsilane, ureidosilane and vinylsilane, titanium-based compounds, aluminum chelates and aluminum/zirconium-based compounds. Examples thereof include silane-based coupling agents such as vinyltrichlorosilane, vinyltrimethoxysilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropyltriethoxysilane, γ-glycidoxypropylmethyldimethoxysilane, γ-methacryloxypropylmethyldiethoxysilane, γ-methacryloxypropyltriethoxysilanevinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, N-β-(aminoethyl)-γ-aminopropyltriethoxysilane, N-β-(aminoethyl)-γ-aminopropylmethyldimethoxysilane, N-phenyl-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane, γ-mercaptopropylmethyldimethoxysilane, 3-isocyanatepropyltriethoxysilane, 3-acryloxypropyltrimethoxysilane and 3-triethoxylyl-N-(1,3-dimethyl-butylidene)propylamine hydrolysate, and titanate-based coupling agents such as isopropyltriisostearoyl titanate, isopropyltris(dioctyl pyrophosphate) titanate, isopropyltri(N-aminoethyl-aminoethyl)titanate, tetraoctylbis(ditridecyl phosphite) titanate, tetra(2,2-diallyloxymethyl-1-butyl)bis(ditridecyl)phosphite titanate, bis(dioctyl pyrophosphate) oxyacetate titanate, bis(dioctyl pyrophosphate)ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate) titanate, isopropyltricumylphenyl titanate and tetraisopropylbis(dioctyl phosphite) titanate, any of which may be used alone or in combinations of two or more.

There are no particular restrictions on the amount of coupling agent added, but it is preferably between 0.05 mass % and 3 mass %, inclusive and more preferably between 0.1 mass % and 2.5 mass %, inclusive, with respect to the inorganic filler (C). An amount of 0.05 mass % or greater will allow satisfactory frame adhesion, and an amount of up to 3 mass % can improve the moldability.

If necessary, known additives may be mixed with the resin composition of the invention, in addition to the components mentioned above. Specific examples of additives that may be used include coloring agents such as carbon black and titanium oxide; release agents such as natural waxes, synthetic waxes, higher fatty acids or their metal salts, paraffin, aliphatic esters and polyethylene oxide; low stress agents such as silicone oil, silicone rubber and olefin rubber; ion scavengers such as hydrotalcite; flame retardants, including inorganic flame retardants such as aluminum hydroxide and antimony trioxide, phosphorus-based flame retardants, nitrogen-based flame retardants, silicone-based flame retardants and organometallic salt-based flame retardants; and other additives such as antioxidants, curing aids, emulsifiers and the like.

The resin composition of the invention will usually be in the form of powder, or molded tablets as necessary, and it can be produced using any method known in the prior art that allows the various components to be uniformly dispersed and mixed. For example, all of the components may be pulverized and mixed with a Henschel mixer or the like, and then the composition prepared by melt kneading with a heated roll, melt kneading with a kneader, mixing with a special mixer, or an appropriate combination of these methods. Also, the semiconductor device of the invention may be produced by the resin-sealed semiconductor elements mounted on a lead frame or the like, by transfer molding using the resin composition of the invention.

A solvent may be used for preparation of the resin composition, but in light of concerns regarding generation of voids by the solvent in the cured product, or poor appearance or reduced reliability, preparation will usually be performed in a solventless condition.

The residual solvent in the resin composition is preferably no greater than 0.1 wt %, more preferably no greater than 0.05 wt % and even more preferably no greater than 0.01 wt %. The residual solvent can be quantified by gas chromatography, for example.

The resin composition of the invention can exhibit a higher flowability by having the inorganic filler (C) surface sufficiently covered by the epoxy resin (A) and curing agent (B), in powdered form or as molded tablets.

The abundance ratio of C atoms of the epoxy resin (A) component or curing agent (B) component and X atoms of the inorganic filler (C) component on the surface of the inorganic filler (C) component before thermosetting treatment, as measured by EDX, is preferably C/X≥1, more preferably C/X≥1.5 and even more preferably C/X≥2. If the value of C/X is within this range, the resin composition can exhibit an even higher flowability. The X atoms are atoms other than C, O, H or N atoms in the main component of the inorganic filler (C) component (defined as the component present in a range of 1 to 95 mol %), and X is defined as the molar concentration of X atoms of the main component. The type of X atom is not particularly restricted, but it is preferably a light element, light metal or metal. The X atom will differ depending on the type of inorganic filler, and it will be an Al atom in the case of alumina, a B atom in the case of boron nitride, a Mg atom in the case of magnesium hydroxide and a Si atom in the case of silica.

Incidentally, C is the molar concentration of carbon atoms in the epoxy resin (A) component or curing agent (B) component, and the main component of the inorganic filler (C) component is the component present at 1 to 95 mol % in the inorganic filler.

The C/X ratio can be measured, for example, by quantifying the elements by SEM-EDX, and calculating the compensation for each element from the peak integral, by a standardless method.

EXAMPLES

The invention will now be explained in greater detail based on examples and comparative examples. However, the invention is in no way limited by these examples.

The components used in the examples and comparative examples were the following.

(Epoxy Resin (A))

Epoxy resin 1: Trisphenolmethane-type epoxy resin with a softening point of 67° C. (EPPN-502H by Nippon Kayaku Co., Ltd.).

Epoxy resin 2: Trisphenolmethane-type epoxy resin with a softening point of 52° C. (EPPN-501H by Nippon Kayaku Co., Ltd.).

Epoxy resin 3: Dicyclopentadiene-modified epoxy resin with a softening point of 73° C. (XD-1000 by Nippon Kayaku Co., Ltd.).

Epoxy resin 4: Liquid triglycidylaminophenol at room temperature (approximately 23° C.) (JER630 by Mitsubishi Chemical Corp.).

(Curing Agent (B))

Curing agent 1: 62.1 g/eq 4,4'-diaminodiphenylsulfone (DDS) with a softening point of 175° C. to 180° C. (Wako Pure Chemical Industries, Ltd.).

Curing agent 2: 105 g/eq novolac-type phenol resin with a softening point of 100° C. (RESITOP PSM-4324 by Gun Ei Chemical Industry Co., Ltd.).

Curing agent 3: 73 g/eq 1,3-bis(3-aminophenoxy)benzene with a softening point of 106.5 to 110° C. (Wako Pure Chemical Industries, Ltd.).

Curing agent 4: 50.6 g/eq 4,4'-diaminodiphenyl ether with a softening point of 186° C. to 187° C. (Wako Pure Chemical Industries, Ltd.).

Curing agent 5: 86.1 g/eq 1,3-bis[2-(4-aminophenyl)-2-propyl]benzene with a softening point of 115° C. (Tokyo Chemical Industry Co., Ltd.).

Curing agent 6: 86.1 g/eq α,α'-bis(4-aminophenyl)-1,4-diisopropylbenzene with a softening point of 165° C. (Tokyo Chemical Industry Co., Ltd.).

(Inorganic Filler (C))

Spherical inorganic filler 1: Spherical molten silica (mean particle size: 32 μm, specific surface area: 1.3 m$^2$/g).

Spherical inorganic filler 2: Spherical molten silica (mean particle size: 4.2 μm, specific surface area: 1.5 m$^2$/g).

Spherical inorganic filler 3: Spherical molten silica (mean particle size: 4.2 μm, specific surface area: 3.5 m$^2$/g).

Spherical inorganic filler 4: Spherical molten silica (mean particle size: 4.2 μm, specific surface area: 4.5 m$^2$/g).

Spherical inorganic filler 5: Spherical molten silica (mean particle size: 2.7 μm, specific surface area: 2.1 m$^2$/g).

Spherical inorganic filler 6: Spherical molten silica (mean particle size: 0.4 μm, specific surface area: 7.3 m$^2$/g).

(Other Components)

Curing accelerator: Triphenylphosphine (Tokyo Chemical Industry Co., Ltd.).

MEK (Wako Pure Chemical Industries, Ltd.)

Examples 1 to 6 and Comparative Examples 2, 3, 5 and 6

A starting material for a resin composition with the composition shown in Table 1 was pulverized and mixed for 5 minutes using a Super Mixer, and then a mixing roll was used for uniform mixing and kneading to obtain epoxy resin compositions for the invention and for comparison. The resin composition for sealing was pulverized with a mixer and tabletted with a tableting machine. The residual solvent of the composition was quantified by gas chromatography (Shimadzu, GC-2014).

Figure 1:
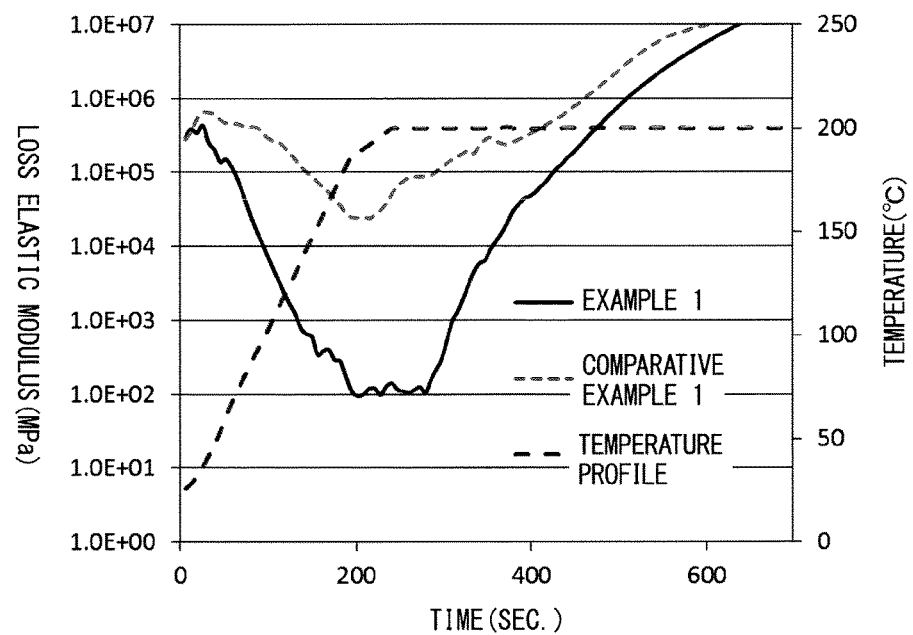
FIG. 1 is a graph showing the relationship between temperature and loss elastic modulus, for tablets of the resin compositions obtained in Example 1 and Comparative Example 1.

The modulus was measured according to the following method. The resin composition tabletted to 1 cmϕ, 2 mm thickness under a pressure of 20 MPa was measured by the parallel plate method using a rheometer (DHR-2 by TA Instruments). After stabilization to a temperature of 23° C. at the site of measurement, under conditions with a 2000 μm gap, a rotation plate diameter of 8 mm, a frequency of 1.0 Hz and a strain of 0.1%, the temperature was increased from 23° C. to 200° C. at a rate of 50° C./min and held at 200° C., and the modulus was measured in that range, recording the minimum modulus for the loss elastic modulus and the modulus 10 minutes after initial temperature increase. FIG. 1 shows the rheometer results for Example 1 and Comparative Example 1, as an example. Based on FIG. 1, the value of the minimum modulus was determined to be 1.0×10$^2$ MPa in Example 1 and 2.0×10$^4$ MPa in Comparative Example 1, and the modulus after 10 minutes was determined to be 1.0×10$^7$ MPa in Example 1 and 2.0×10$^7$ MPa in Comparative Example 1.

The C/Si ratio was measured by the following method. The resin composition tabletted to 1 cmϕ and a thickness of 1 cm under a pressure of 20 MPa was split open at ordinary temperature, to prepare a split cross-section of the interior of the sample. After fixing it to a SEM sample stage, it was subjected to conductive treatment for use as a sample for microscopy. Using an ultrahigh-resolution field emission scanning electron microscope (SU8220 by Hitachi High-Technologies Corp.) as SEM and an energy dispersive X-ray analyzer (NORAN System Seven by Thermo Fisher Scientific Inc.) as EDX, under conditions with an acceleration voltage of 5 kV, high probe current, a WD (working distance) of 15 mm, EDX measuring mode, and an area analysis region of approximately 10 μm, the inorganic filler surface of the active cross-section was set as the target with a measuring time of 60 seconds. Compensation for the quantified value for the element was calculated for each element from the peak integral, using a standardless method. An example of the results for Example 1 is shown in FIG. 2 and Table 7, and an example of the results for Comparative Example 1 is shown in FIG. 3 and Table 8. Judging from the shaded portions of the SEM photograph, and the EDX results, it was confirmed that Pt2-1 in FIG. 2 and Table 7 is the inorganic filler surface and Pt2-2 is a trace of the detached inorganic filler. Focusing on the results of EDX in FIG. 2 and Table 7, a Si peak attributable to the inorganic filler was observed for Pt2-1 since it was the inorganic filler surface, while virtually no Si peak attributable to the inorganic filler was observed for Pt2-2, as it was a trace of the detached inorganic filler.

A module with a power semiconductor element mounted on it was fabricated by a common method. The tabletted resin composition was used to cover the entire preliminary module by transfer molding, and subjected to heat curing at 250° C. for 8 hours to fabricate a resin-sealed power semiconductor device.

A schematic diagram of the fabricated power semiconductor device is shown in FIG. 4. In the power semiconductor device 4, the lower side electrode of the power semiconductor element 41 was electrically connected to a lead part 43 via a joining material 42. The main electrode of the power semiconductor element 41 was electrically connected to the lead part 43 via a wire 44. The lower side of the lead part 43 had a radiator plate 46 provided through a heat transfer sheet 45, for outward escape of heat generated by the power semiconductor element 41. Portions of the lead part 43 and radiator plate 46 were each exposed while sealing the periphery of the power semiconductor element 41 with a sealing material 47. The sealing material 47 includes a resin composition prepared by the procedure described above.

Each fabricated power semiconductor device was used, for evaluation of the cycle life of the power semiconductor devices for Examples 1 to 6 and Comparative Examples 1 to 6 by power cycle testing ($\Delta Tc=125°$ C., 75° C. to 200° C.)

Comparative Example 1

Comparative Example 1 shown in Table 1 was carried out by the same method as Example 1, except that after pulverizing and mixing for 5 minutes with a super mixer, the mixture was further pulverized and mixed for 25 minutes with a super mixer, without uniform mixing and kneading with a mixing roll.

Comparative Example 4

Comparative Example 4 shown in Table 1 was carried out by the same method as Example 1, except that the inorganic filler was treated beforehand with MEK as an organic solvent by the method described in International Patent Publication No. 2015-125760.

The results are shown in Table 1. A distinct difference was seen between the power cycle test results for Examples 1 to 6 and Comparative Examples 1 to 6. Since a different mixing method was used in Comparative Example 1, since the weight fraction of the inorganic filler was too high in Comparative Example 2, since the specific surface area of the inorganic filler was too high with respect to the composition in Comparative Example 3, and since the particle size of the inorganic filler was too small in Comparative Example 4, the inorganic fillers failed to be sufficiently covered with the resin components, and consequently defects tended to be produced in the power cycle test. In Comparative Example 5, curing of the composition was incomplete as indicated by the modulus value after 10 minutes, and consequently defects were likely to be produced in the power cycle test. In Comparative Example 6, the presence of the solvent in the composition probably resulted in defects in the cured product, and consequently defects were likely to be produced in the power cycle test.

TABLE 1

| | | Examples | | | | | | Comparative Examples | | | | | |
|---|---|---|---|---|---|---|---|---|---|---|---|---|---|
| | | 1 | 2 | 3 | 4 | 5 | 6 | 1 | 2 | 3 | 4 | 5 | 6 |
| Composition | Epoxy resin (A) Epoxy resin 1 | 22 | 13 | 7 | 22 | 22 | 22 | 22 | 4 | 22 | 22 | 19 | 22 |
| | Curing agent (B) Curing agent 1 | 8 | 4 | 3 | 8 | 8 | 8 | 8 | 1 | 8 | 8 | — | 8 |
| | Curing agent 2 | — | — | — | — | — | — | — | — | — | — | 11 | — |
| | Inorganic filler (C) Inorganic filler 1 | 70 | 83 | 63 | — | — | — | 70 | 67 | — | — | — | — |
| | Inorganic filler 2 | — | — | 27 | 70 | — | — | — | 29 | — | — | — | — |
| | Inorganic filler 3 | — | — | — | — | — | — | — | — | 70 | — | — | — |
| | Inorganic filler 4 | — | — | — | — | 70 | — | — | — | — | — | — | — |
| | Inorganic filler 5 | — | — | — | — | — | 70 | — | — | — | — | 70 | 70 |
| | Inorganic filler 6 | — | — | — | — | — | — | — | — | — | 70 | — | — |
| | Solvent MEK | — | — | — | — | — | — | — | — | — | — | — | 0.1 |
| | Total | 100 | 100 | 100 | 100 | 100 | 100 | 100 | 100 | 100 | 100 | 100 | 100 |
| | Inorganic filler weight fraction [wt %] | 70 | 83 | 90 | 70 | 70 | 70 | 70 | 96 | 70 | 70 | 70 | 70 |
| | Specific surface area of inorganic filler in composition ($m^2/g$) | 0.9 | 1.1 | 1.2 | 0.9 | 2.4 | 1.5 | 0.9 | 1.3 | 3.2 | 4.9 | 0.9 | 0.9 |
| | Solvent content (wt %) | 0 | 0 | 0 | 0 | 0 | 0 | 0 | 0 | 0 | 0 | 0 | 0.1 |
| Physical properties | Rheological properties Minimum modulus [MPa] | 1.0E+02 | 2.0E+02 | 6.0E+02 | 2.0E+02 | 1.0E+03 | 7.0E+02 | 2.0E+04 | 2.0E+05 | 1.0E+05 | 1.0E+05 | 1.0E+02 | 1.0E+02 |
| | Modulus after 10 min [MPa] | 1.0E+07 | 1.0E+06 | 1.0E+06 | 1.0E+06 | 1.0E+06 | 1.0E+06 | 1.0E+07 | 1.0E+06 | 1.0E+06 | 1.0E+06 | 1.0E+02 | 1.0E−07 |
| | Inorganic filler coverage (EDX: C/Si) | 2.0 | 2.0 | 1.0 | 2.0 | 1.0 | 1.0 | 0.3 | 0.3 | 0.3 | 0.3 | 2.0 | 2.0 |
| | Epoxy resin softening point °C | 67 | 67 | 67 | 67 | 67 | 67 | 67 | 67 | 67 | 67 | 67 | 67 |
| Evaluation results | Power cycle test results | A | B | C | B | C | B | E | E | D | D | E | E |

TABLE 2

Power cycle 200° C.–75° C. 50,000 cycles

5/5 completed: A
4/5-3/5 completed: B
2/5-1/5 completed: C
0/5 completed: D
Defects at start: E

Examples 7 and 8, Comparative Example 7

Example 1, Examples 7 and 8 and Comparative Example 7 shown in Table 3 were carried out by the same method as Example 1, except that a heat cycle test was performed at 200° C. to −50° C. instead of the power cycle test of Example 1. The details regarding the heat cycle test are as follows.

Using a TSE-11 heat shock apparatus by Espec Corp., with one cycle consisting of holding the sample at 200° C. for 30 minutes and at −50° C. for 30 minutes, 500 cycles were conducted and the sample was then removed and visual confirmation made of any cracking or peeling in the cured product (Table 4).

The results are shown in Table 3. In Examples 1, 7 and 8, no cracking was observed after the heat cycle test, but cracking was observed in the heat cycle test in Comparative Example 7. The tendency that defects were generated in the heat cycle test in Comparative Example 7 was presumably because the softening point of the epoxy resin was too low.

TABLE 4

Temperature cycle 200° C.,
−50° C. 30 min–30 min, 500 cycles

5/5 no outer appearance
abnormalities: A
Partial cracking: B

Examples 9 to 12, Comparative Example 8

Example 1, Examples 9 to 12 and Comparative Example 8 shown in Table 5 were performed by the same method as Table 3, except that the temperature conditions for the heat cycle test were 180° C. to −50° C. (Table 6).

The results are shown in Table 5. In Examples 1 and 9 to 12, no cracking was observed after the heat cycle test, but cracking was observed in the heat cycle test in Comparative Example 8. In Comparative Example 8, the heat resistance of the cured product was insufficient due to the low softening point of the curing agent and the crosslink density of the cured product was insufficient due to the excessively large equivalent value of the curing agent, and presumably for these reasons, defects were likely to be produced in the heat cycle test.

TABLE 3

|  |  |  | Examples | | | Comp. |
|---|---|---|---|---|---|---|
|  |  |  | 1 | 7 | 8 | 7 |
| Composition | Epoxy resin (A) | Epoxy resin 1 | 22 | — | — | — |
|  |  | Epoxy resin 2 | — | 22 | — | — |
|  |  | Epoxy resin 3 | — | — | 24 | — |
|  |  | Epoxy resin 4 | — | — | — | 18 |
|  | Curing agent (B) | Curing agent 1 | 8 | 8 | 6 | 12 |
|  | Inorganic filler (C) | Inorganic filler 1 | 70 | 70 | 70 | 70 |
|  | Solvent | MEK | — | — | — | — |
|  | Total |  | 100 | 100 | 100 | 100 |
| Inorganic filler weight fraction [wt %] |  |  | 70 | 70 | 70 | 70 |
| Specific surface area of inorganic filler in composition (m$^2$/g) |  |  | 0.9 | 0.9 | 0.9 | 0.9 |
| Solvent content (wt %) |  |  | 0 | 0 | 0 | 0 |
| Physical properties | Rheological properties | Minimum modulus [MPa] | 1.0E+02 | 1.0E+02 | 1.0E+02 | 1.0E+02 |
|  |  | Modulus after 10 min [MPa] | 1.0E+07 | 1.0E+06 | 1.0E+06 | 1.0E+05 |
|  | Inorganic filler coverage | (EDX: C/Si) | 2.0 | 1.0 | 2.0 | 2.0 |
|  | Epoxy resin softening point | ° C. | 67 | 50 | 73 | ≤RT |
| Evaluation results | Heat cycle test results |  | A | A | A | B |

TABLE 5

|  |  |  | Examples | | | | | Comp. Example |
|---|---|---|---|---|---|---|---|---|
|  |  |  | 1 | 9 | 10 | 11 | 12 | 8 |
| Composition | Epoxy resin (A) | Epoxy resin 1 | 22 | 21 | 23 | 20 | 20 | 19 |
|  | Curing agent (B) | Curing agent 1 | 8 | — | — | — | — | — |
|  |  | Curing agent 2 | — | — | — | — | — | 11 |
|  |  | Curing agent 3 | — | 9 | — | — | — | — |
|  |  | Curing agent 4 | — | — | 7 | — | — | — |
|  |  | Curing agent 5 | — | — | — | 10 | — | — |
|  |  | Curing agent 6 | — | — | — | — | 10 | — |
|  | Curing accelerator | Curing accelerator 1 | — | — | — | — | — | 0.2 |
|  | Inorganic filler (C) | Inorganic filler 1 | 70 | 70 | 70 | 70 | 70 | 70 |
|  | Total |  | 100 | 100 | 100 | 100 | 100 | 100 |
| Inorganic filler weight fraction [wt %] | | | 70 | 70 | 70 | 70 | 70 | 70 |
| Specific surface area of inorganic filler in composition ($m^2/g$) | | | 0.9 | 0.9 | 0.9 | 0.9 | 0.9 | 0.9 |
| Solvent content (wt %) | | | 0 | 0 | 0 | 0 | 0 | 0 |
| Physical properties | Rheological properties | Minimum modulus [MPa] | 1.0E+02 | 1.0E+02 | 1.0E+02 | 1.0E+02 | 1.0E+02 | 1.0E102 |
|  |  | Modulus after 10 min [MPa] | 1.0E+07 | 1.0E+06 | 1.0E+06 | 1.0E+06 | 1.0E+06 | 1.0E+05 |
|  | Inorganic filler coverage | (EDX: C/Si) | 2.0 | 2.0 | 2.0 | 2.0 | 2.0 | 2.0 |
|  | Epoxy resin softening point | °C. | 67 | 67 | 67 | 67 | 67 | 67 |
| Evaluation results | Heat cycle test results | | A | A | A | A | A | B |

TABLE 6

| Temperature cycle 180° C., −50° C. 30 min–30 min, 500 cycles |
|---|
| 5/5 no outer appearance abnormalities: A |
| Partial cracking: B |

TABLE 7

| Measured location | Pt2-1 | Pt2-2 |
|---|---|---|
| C | 37 | 84 |
| Si | 18 | 1 |
| C/Si | 2 | — |

The quantitative element values are the values compensated for each element from the peak integrals in the EDX charts shown in FIG. 2(2-b) and FIG. 2(2-c), using a standardless method.

TABLE 8

| Measured location | Pt3-1 | Pt3-2 |
|---|---|---|
| C | 6 | 7 |
| Si | 26 | 29 |
| C/Si | 0.2 | 0.2 |

The quantitative element values are the values compensated for each element from the peak integrals in the EDX charts shown in FIG. 3(3-b) and FIG. 3(3-c), using a standardless method.

Based on these results, the power semiconductor devices sealed with sealing materials using resin compositions of the invention exhibited excellent power cycle test resistance and heat cycle test resistance.

INDUSTRIAL APPLICABILITY

A sealing material using a resin composition of the invention can be used in a wide range of electrical and electronic fields including semiconductor sealing materials and insulating materials for printed circuit boards. In electrical and electronic fields, highly reliable electronic devices can be realized when the sealing material is used in a power semiconductor, such as an on-vehicle power module, for example, that is intended to be applied under higher temperature conditions.

BRIEF DESCRIPTION OF THE REFERENCE SYMBOLS

4 Power semiconductor device
41 Power semiconductor element
42 Joining material
43 Lead part
44 Wire
45 Heat transfer sheet
46 Radiator plate
47 Sealing material

The invention claimed is:
1. A resin composition including (A) an epoxy resin, (B) a curing agent and (C) an inorganic filler, and satisfying the following conditions:
(II-I) X atoms other than C, O, H and N atoms in the main component of the inorganic filler (C) (the component present in a range of 1 to 95 mol %), based on EDX measurement, are on the surface of the inorganic filler (C) in the resin composition;

(II-II) the weight percentage of the inorganic filler (C) in the resin composition is no greater than 95 wt %;

(II-III) the mean particle size of the inorganic filler (C) is 0.5 μm or greater;

(II-IV) a ratio of the specific surface area of the inorganic filler (C) with respect to the total resin composition is no greater than 2 m²/g;

(II-V) the softening point of the epoxy resin (A) is 35° C. or higher;

(II-VI) the residual solvent in the resin composition is less than 0.1 wt %; and (II-VII) the softening point of the curing agent (B) is 105° C. or higher; and wherein, under the condition (II-I), the abundance ratio of C atoms of the epoxy resin (A) or curing agent (B) and the X atoms of the inorganic filler (C), based on EDX measurement, on the surface of the inorganic filler (C) in the resin composition satisfies the following formula:

$$C/X => 1$$

wherein C is defined as a molar concentration of the C atoms and X is defined as a molar concentration of the X atoms.

2. The resin composition according to claim 1, wherein, under the condition (II-VII), the equivalent value of the curing agent (B) is no greater than 90 g/eq and the softening point is 105° C. or higher.

3. A resin composition according to claim 1, wherein the curing agent (B) is a compound with amino groups.

4. A sealing material comprising the cured product of a resin composition according to claim 1.

5. A semiconductor device wherein a semiconductor element is sealed with a sealing material according to claim 4.

6. A method for producing a semiconductor device, including a step of sealing a semiconductor element by compression molding using a sealing material according to claim 4.

* * * * *